(12) United States Patent
Chiu et al.

(10) Patent No.: US 11,682,724 B2
(45) Date of Patent: Jun. 20, 2023

(54) HIGH VOLTAGE TRANSISTOR STRUCTURE AND MANUFACTURING METHOD THEREOF

(71) Applicant: United Microelectronics Corp., Hsinchu (TW)

(72) Inventors: Chun-Ya Chiu, Tainan (TW); Ssu-I Fu, Kaohsiung (TW); Chih-Kai Hsu, Tainan (TW); Chin-Hung Chen, Tainan (TW); Chia-Jung Hsu, Tainan (TW); Yu-Hsiang Lin, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 107 days.

(21) Appl. No.: 17/406,028

(22) Filed: Aug. 18, 2021

(65) Prior Publication Data

US 2023/0037410 A1   Feb. 9, 2023

(30) Foreign Application Priority Data

Aug. 5, 2021  (CN) .......................... 202110895424.9

(51) Int. Cl.
*H01L 29/78* (2006.01)
*H01L 29/66* (2006.01)

(52) U.S. Cl.
CPC .... *H01L 29/7816* (2013.01); *H01L 29/66689* (2013.01)

(58) Field of Classification Search
CPC .......... H01L 29/7816; H01L 29/66689; H01L 29/7833; H01L 29/66553; H01L 29/7817; H01L 29/665; H01L 29/66659; H01L 21/26586; H01L 29/456; H01L 29/0847; H01L 29/7835; H01L 29/0607;
(Continued)

(56) References Cited

U.S. PATENT DOCUMENTS 7,977,715 B2    7/2011  Cai
2016/0064552 A1*  3/2016  Cheng ............... H01L 21/76224
                                                      438/286
(Continued)

OTHER PUBLICATIONS

Jong Mun Park et al., "Hot-carrier behaviour and ron-BV trade-off optimization for p-channel LDMOS transistors in a 180 nm HV-CMOS technology," 2012 24th International Symposium on Power Semiconductor Devices and ICs, Jun. 2012, pp. 189-192.

*Primary Examiner* — Mohammed R Alam
(74) *Attorney, Agent, or Firm* — J.C. Patents (57) ABSTRACT

A high voltage transistor structure including a substrate, a first drift region, a second drift region, a first cap layer, a second cap layer, a gate structure, a first source and drain region, and a second source and drain region is provided. The first and second drift regions are disposed in the substrate. The first and second cap layers are respectively disposed on the first and second drift regions. The gate structure is disposed on the substrate and located over at least a portion of the first drift region and at least a portion of the second drift region. The first and second source and drain regions are respectively disposed in the first and second drift regions and located on two sides of the gate structure. The size of the first drift region and the size of the second drift region are asymmetric.

20 Claims, 5 Drawing Sheets

(58) Field of Classification Search
CPC . H01L 29/0878; H01L 29/0882; H01L 29/36; H01L 29/6668
See application file for complete search history.

(56) References Cited

U.S. PATENT DOCUMENTS

| | | | |
|---|---|---|---|
| 2018/0190816 A1* | 7/2018 | Siddiqui | H01L 29/66681 |
| 2022/0093798 A1* | 3/2022 | Chiu | H01L 29/66636 |

* cited by examiner

HIGH VOLTAGE TRANSISTOR STRUCTURE AND MANUFACTURING METHOD THEREOF

CROSS-REFERENCE TO RELATED APPLICATION

This application claims the priority benefit of China application no. 202110895424.9, filed on Aug. 5, 2021. The entirety of the above-mentioned patent application is hereby incorporated by reference herein and made a part of this specification.

BACKGROUND OF THE INVENTION

Field of the Invention

The invention relates to a semiconductor structure and a manufacturing method thereof, and particularly relates to a high voltage transistor structure and a manufacturing method thereof.

Description of Related Art

Currently, the high voltage transistor device is widely used in various electronic products. With the advancement of science and technology, the size of the electronic device continues to shrink, so it becomes more difficult to increase the breakdown voltage of the high voltage transistor device. Therefore, how to increase the breakdown voltage of the high voltage transistor device is the goal of continuous efforts.

SUMMARY OF THE INVENTION

The invention provides a high voltage transistor structure and a manufacturing method thereof, which can increase the breakdown voltage of the high voltage transistor device.

The invention provides a high voltage transistor structure, which includes a substrate, a first drift region, a second drift region, a first cap layer, a second cap layer, a gate structure, a first source and drain region, and a second source and drain region. The first drift region and the second drift region are disposed in the substrate. The first cap layer and the second cap layer are respectively disposed on the first drift region and the second drift region. The gate structure is disposed on the substrate and located over at least a portion of the first drift region and at least a portion of the second drift region. The first source and drain region and the second source and drain region are respectively disposed in the first drift region and the second drift region and located on two sides of the gate structure. The size of the first drift region and the size of the second drift region are asymmetric.

According to an embodiment of the invention, in the high voltage transistor structure, the material of the first drift region and the material of the second drift region may be an epitaxial material, respectively.

According to an embodiment of the invention, in the high voltage transistor structure, the size of the second drift region may be greater than the size of the first drift region.

According to an embodiment of the invention, in the high voltage transistor structure, the depth of the second drift region may be greater than the depth of the first drift region.

According to an embodiment of the invention, in the high voltage transistor structure, the width of the second drift region may be greater than the width of the first drift region.

According to an embodiment of the invention, in the high voltage transistor structure, each of the first drift region and the second drift region may include a first epitaxial layer and a second epitaxial layer. The second epitaxial layer is located in the first epitaxial layer. The dopant concentration of the second epitaxial layer may be greater than the dopant concentration of the first epitaxial layer. The dopant concentration of the first source and drain region and the dopant concentration of the second source and drain region may be greater than the dopant concentration of the second epitaxial layer.

According to an embodiment of the invention, in the high voltage transistor structure, each of the first drift region and the second drift region may further include a third epitaxial layer. The first epitaxial layer is located in the third epitaxial layer. The third epitaxial layer may be an undoped epitaxial layer.

According to an embodiment of the invention, in the high voltage transistor structure, the first cap layer may be located between the gate structure and the first drift region, and the second cap layer may be located between the gate structure and the second drift region.

According to an embodiment of the invention, in the high voltage transistor structure, the material of the first cap layer and the material of the second cap layer may be an undoped epitaxial material, respectively.

According to an embodiment of the invention, in the high voltage transistor structure, the gate structure may include a gate and a gate dielectric layer. The gate is disposed on the substrate. The gate dielectric layer is located between the gate and the substrate.

According to an embodiment of the invention, in the high voltage transistor structure, the gate structure may further include a spacer. The spacer is disposed on a sidewall of the gate.

The invention provides a method of manufacturing a high voltage transistor structure, which includes the following steps. A substrate is provided. A first drift region and a second drift region are formed in the substrate. A first cap layer and a second cap layer are respectively formed on the first drift region and the second drift region. A gate structure is formed on the substrate. The gate structure is located over at least a portion of the first drift region and at least a portion of the second drift region. A first source and drain region and a second source and drain region are respectively formed in the first drift region and the second drift region. The first source and drain region and the second source and drain region are located on two sides of the gate structure. The size of the first drift region and the size of the second drift region are asymmetric.

According to an embodiment of the invention, in the method of manufacturing the high voltage transistor structure, the method of forming the first drift region and the second drift region may include the following steps. A first recess and a second recess are formed in the substrate. The first drift region and the second drift region are respectively formed in the first recess and the second recess.

According to an embodiment of the invention, in the method of manufacturing the high voltage transistor structure, the material of the first drift region and the material of the second drift region may be an epitaxial material, respectively.

According to an embodiment of the invention, in the method of manufacturing the high voltage transistor structure, the size of the second drift region may be greater than the size of the first drift region.

According to an embodiment of the invention, in the method of manufacturing the high voltage transistor structure, the depth of the second drift region may be greater than the depth of the first drift region.

According to an embodiment of the invention, in the method of manufacturing the high voltage transistor structure, the width of the second drift region may be greater than the width of the first drift region.

According to an embodiment of the invention, in the method of manufacturing the high voltage transistor structure, each of the first drift region and the second drift region may include a first epitaxial layer and a second epitaxial layer. The second epitaxial layer is located in the first epitaxial layer. The dopant concentration of the second epitaxial layer may be greater than the dopant concentration of the first epitaxial layer. The dopant concentration of the first source and drain region and the dopant concentration of the second source and drain region may be greater than the dopant concentration of the second epitaxial layer.

According to an embodiment of the invention, in the method of manufacturing the high voltage transistor structure, each of the first drift region and the second drift region may further include a third epitaxial layer. The first epitaxial layer is located in the third epitaxial layer. The third epitaxial layer may be an undoped epitaxial layer.

According to an embodiment of the invention, in the method of manufacturing the high voltage transistor structure, the first cap layer may be located between the gate structure and the first drift region, and the second cap layer may be located between the gate structure and the second drift region.

Based on the above description, in the high voltage transistor structure and the manufacturing method thereof according to the invention, the size of the first drift region and the size of the second drift region are asymmetric, thereby increasing the breakdown voltage of the high voltage transistor device. In addition, the breakdown voltage of the high voltage transistor device can be flexibly adjusted by adjusting the size of the first drift region and/or the size of the second drift region. Furthermore, the breakdown voltage of the high voltage transistor device can be flexibly adjusted by adjusting the thickness of the first cap layer and/or the thickness of the second cap layer.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are cross-sectional views illustrating a manufacturing process of a high voltage transistor structure according to an embodiment of the invention.

Figure 1A:
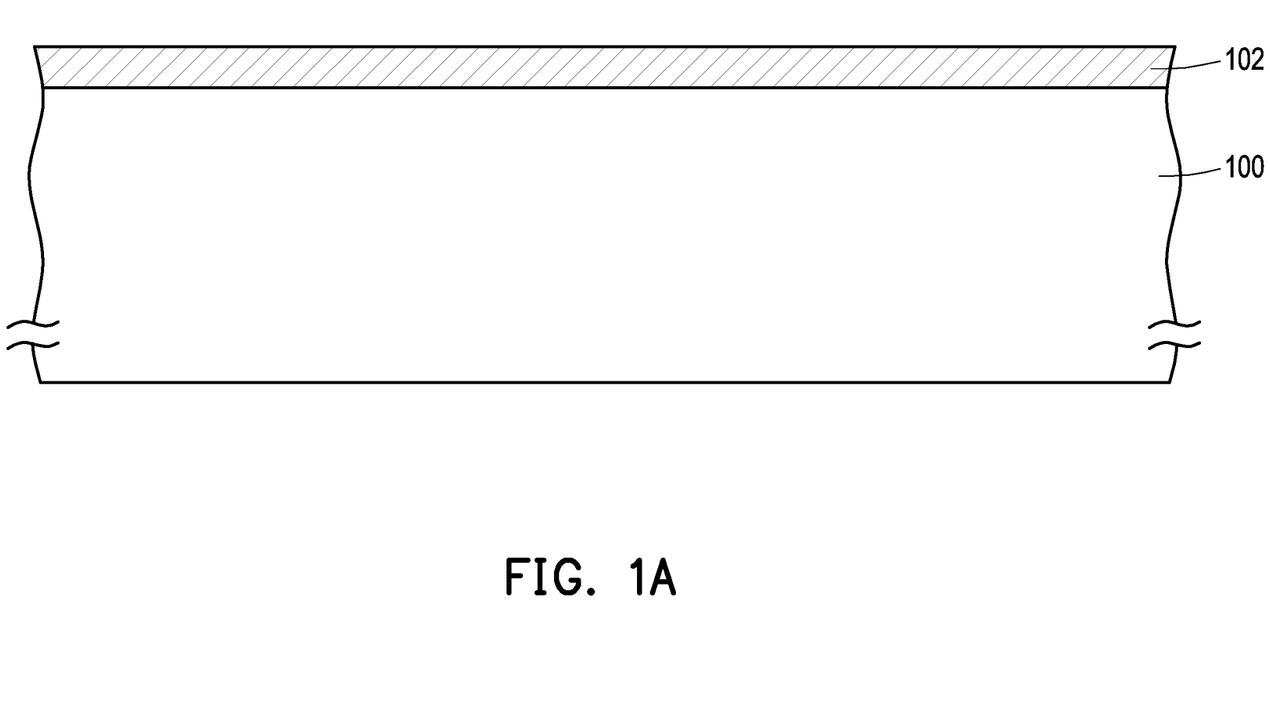
FIG. 1A to FIG. 1E are cross-sectional views illustrating a manufacturing process of a high voltage transistor structure according to an embodiment of the invention.

Referring to FIG. 1A, a substrate 100 is provided. The substrate 100 may be a semiconductor substrate such as a silicon substrate. A hard mask material layer 102 may be formed on the substrate 100. The material of the hard mask material layer 102 is, for example, silicon nitride (SiN), silicon oxynitride (SiON), or silicon carbonitride (SiCN). The method of forming the hard mask material layer 102 is, for example, a chemical vapor deposition (CVD) method.

Figure 1B:
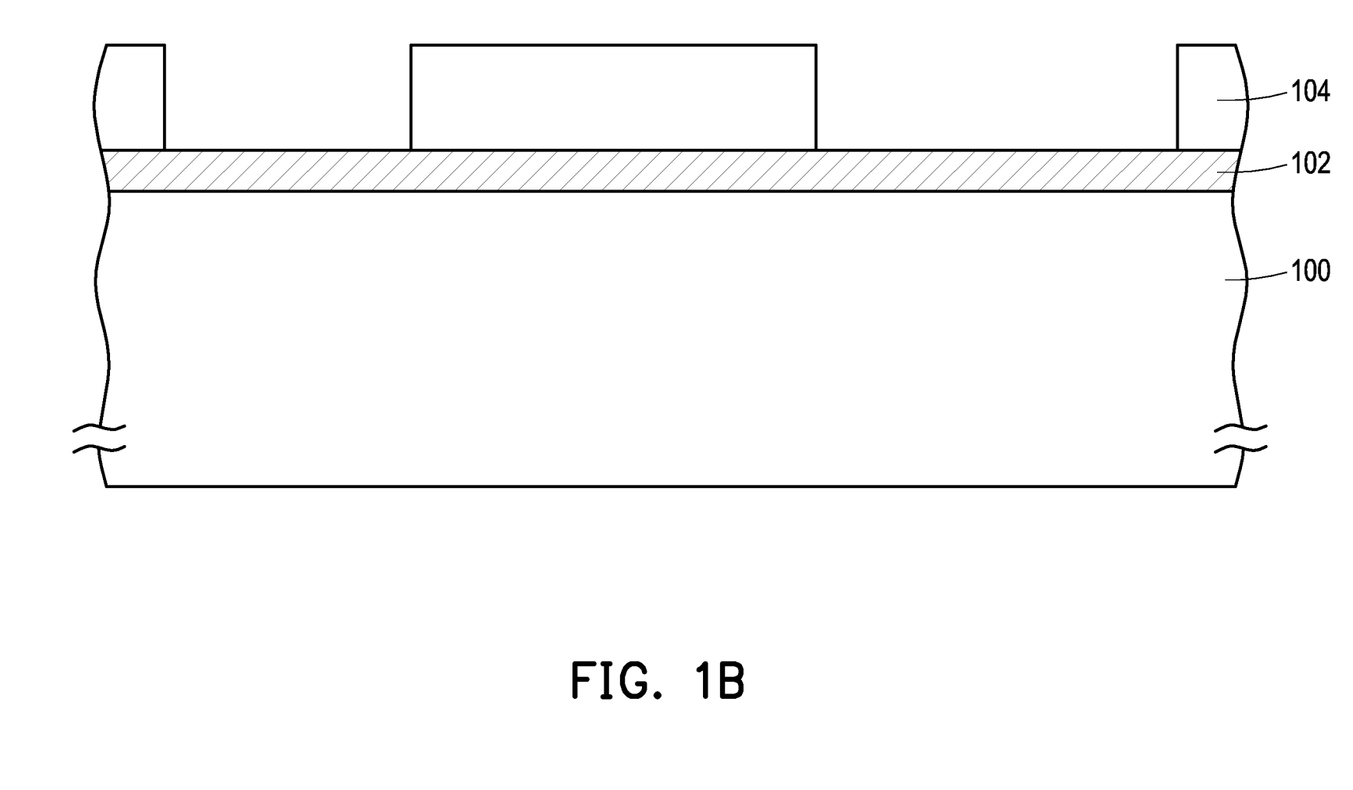

Referring to FIG. 1B, a patterned photoresist layer 104 may be formed on the hard mask material layer 102. The patterned photoresist layer 104 may be formed by a lithography process.

Figure 1C:
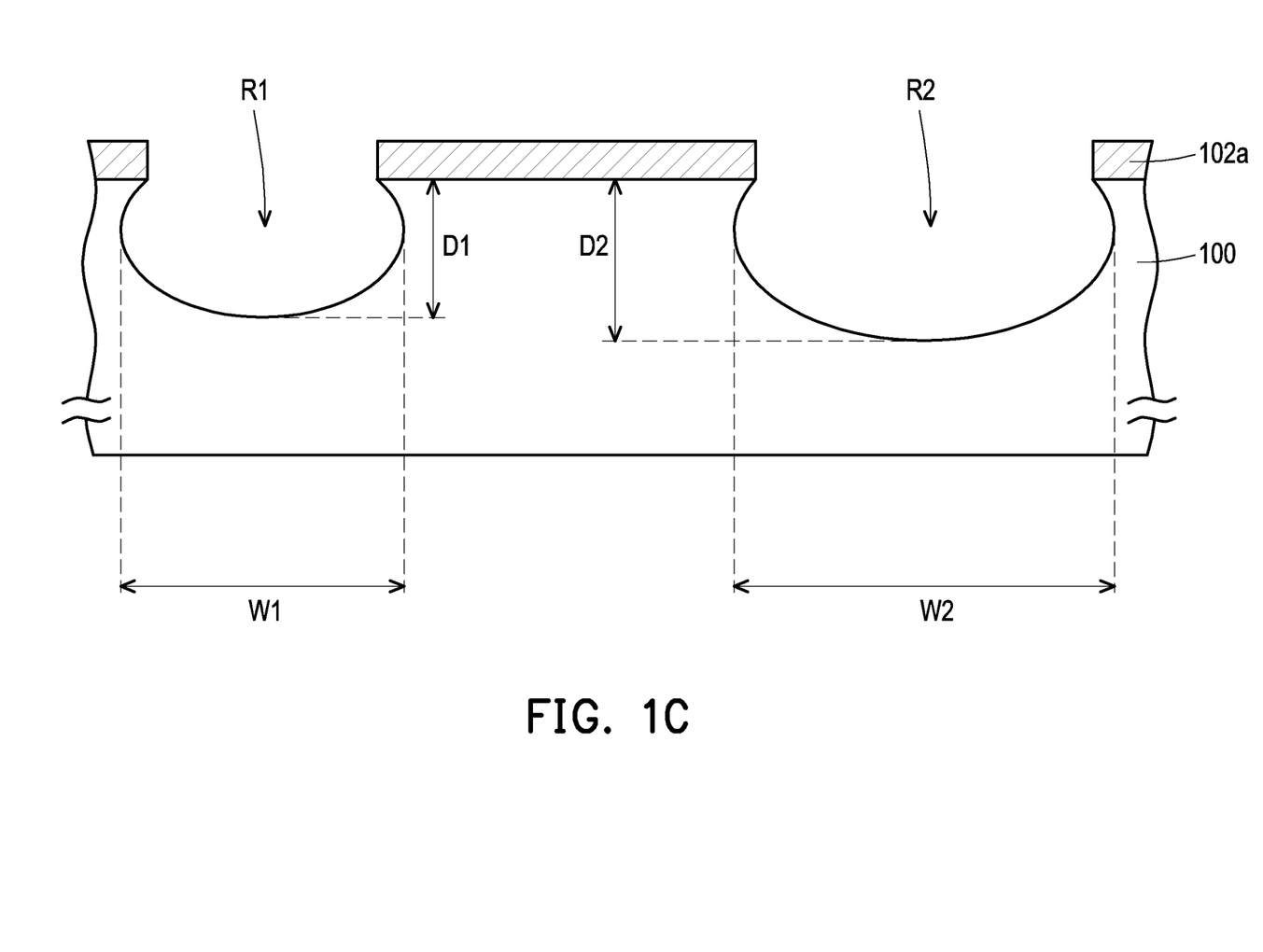

Referring to 1C, a portion of the hard mask material layer 102 may be removed by using the patterned photoresist layer 104 as a mask, so that a hard mask layer 102a may be formed. The method of removing a portion of the hard mask material layer 102 is, for example, a dry etching method.

A portion of the substrate 100 may be removed by using the patterned photoresist layer 104 as a mask. Therefore, a recess R1 and a recess R2 may be formed in the substrate 100. The size of the recess R2 and the size of the recess R1 may be asymmetric. In some embodiments, the size of the recess R2 may be greater than the size of recess R1. In the present embodiment, "size" may refer to the depth or the width of the component. In addition, in the present embodiment, "depth" refers to "maximum depth", and "width" refers to "maximum width". In some embodiments, the depth D2 of the recess R2 may be greater than the depth D1 of the recess R1. In some embodiments, the width W2 of the recess R2 may be greater than the width W1 of the recess R1. The method of removing a portion of the substrate 100 is, for example, a dry etching method. Furthermore, the shape of the recess R1 and the shape of the recess R2 are not limited to the shape shown in FIG. 1C.

The patterned photoresist layer 104 may be removed. The method of removing the patterned photoresist layer 104 is, for example, a dry stripping method or a wet stripping method. In some embodiments, after the patterned photoresist layer 104 is removed, a cleaning process may be performed.

Figure 1D:
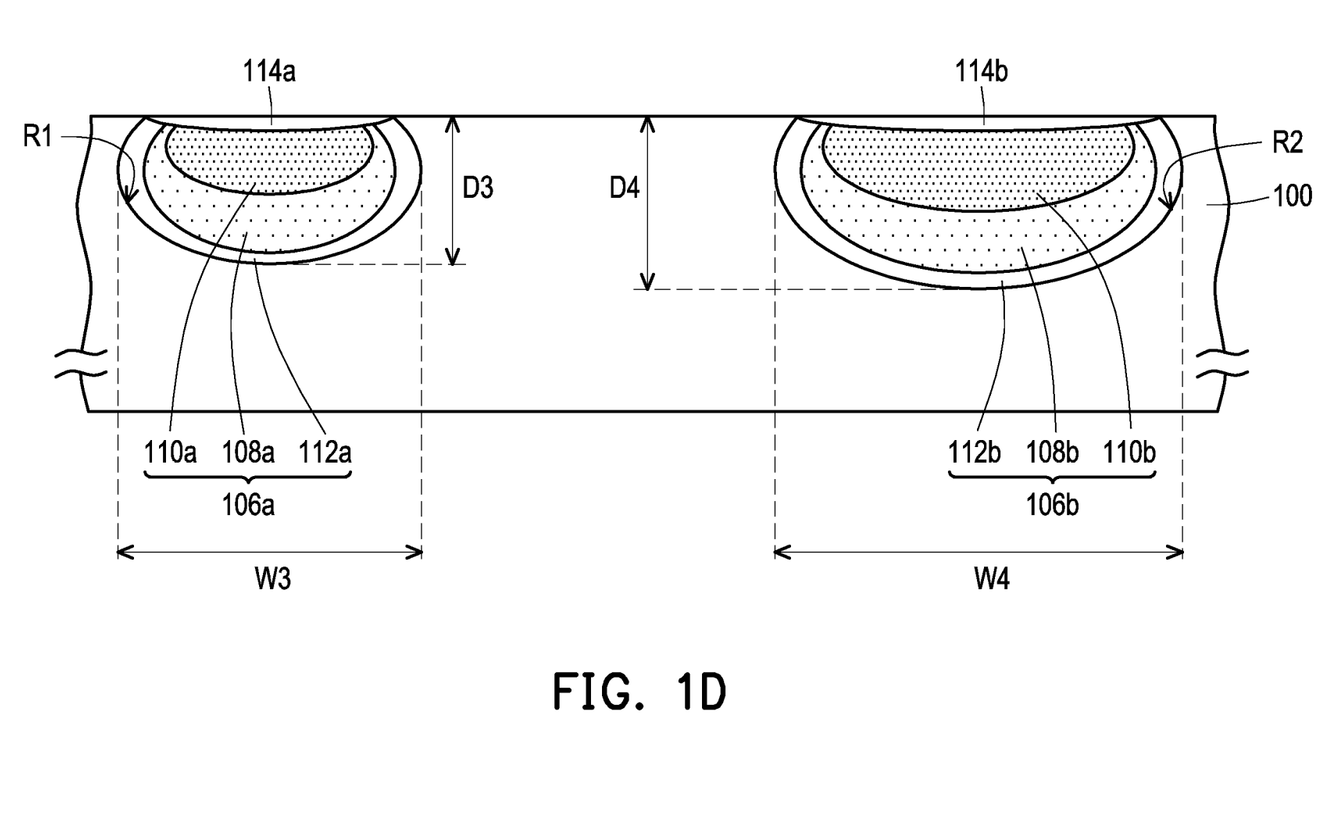

Referring to FIG. 1D, a drift region 106a and a drift region 106b may be respectively formed in recess R1 and recess R2. Therefore, a drift region 106a and a drift region 106b are formed in the substrate 100. The material of the drift region 106a and the material of the drift region 106b may be an epitaxial material, respectively, thereby increasing the turn-on current ($I_{on}$). For example, when the high voltage transistor structure 10 (FIG. 1E) to be manufactured is a P-type metal oxide semiconductor (PMOS) transistor, the material of the drift region 106a and the material of the drift region 106b may be silicon germanium (SiGe), respectively. When the high voltage transistor structure 10 (FIG. 1E) to be manufactured is an N-type metal oxide semiconductor (NMOS) transistor, the material of the drift region 106a and the material of the drift region 106b may be silicon phosphide (SiP), respectively.

The size of the drift region 106a and the size of the drift region 106b are asymmetric, thereby increasing the breakdown voltage of the high voltage transistor device. In addition, the breakdown voltage of the high voltage transistor device can be flexibly adjusted by adjusting the size of the drift region 106a and/or the size of the drift region 106b. In some embodiments, the size of the drift region 106b may be greater than the size of the drift region 106a. In some embodiments, the depth D4 of the drift region 106b may be greater than the depth D3 of the drift region 106a. In some embodiments, the width W4 of the drift region 106b may be greater than the width W3 of the drift region 106a. Furthermore, the shape of the drift region 106a and the shape of the drift region 106b are not limited to the shape shown in FIG. 1D.

The drift region 106a may include an epitaxial layer 108a and an epitaxial layer 110a. The epitaxial layer 110a is located in the epitaxial layer 108a. In some embodiments, the epitaxial layer 108a and the epitaxial layer 110a may be epitaxial layers doped with a P-type dopant (e.g., boron) or an N-type dopant (e.g., phosphorus). The dopant concentration of the epitaxial layer 110a may be greater than the dopant concentration of the epitaxial layer 108a, so that the drift region 106a may have a gradient dopant concentration. Moreover, the drift region 106a may further include an epitaxial layer 112a. The epitaxial layer 108a is located in the epitaxial layer 112a. That is, the epitaxial layer 112a may be located between the epitaxial layer 108a and the substrate 100. The epitaxial layer 112a may be an undoped epitaxial layer. In some embodiments, the breakdown voltage of the high voltage transistor device can be flexibly adjusted by adjusting the thickness of the epitaxial layer 112a.

In addition, when the high voltage transistor structure 10 (FIG. 1E) to be manufactured is a PMOS transistor, the epitaxial layer 108a and the epitaxial layer 110a may be of P-type conductive type, and the material of the epitaxial layer 108a, the material of the epitaxial layer 110a, and the material of the epitaxial layer 112a may be silicon germanium (SiGe), respectively. When the high voltage transistor structure 10 (FIG. 1E) to be manufactured is an NMOS transistor, the epitaxial layer 108a and the epitaxial layer 110a may be of N-type conductive type, and the material of the epitaxial layer 108a, the material of the epitaxial layer 110a, and the material of the epitaxial layer 112a may be silicon phosphide (SiP), respectively. The method of forming the drift region 106a is, for example, sequentially forming the epitaxial layer 112a, the epitaxial layer 108a, and the epitaxial layer 110a in the recess R1 by a metal organic chemical vapor deposition (MOCVD) method. Therefore, the epitaxial layer 112a, the epitaxial layer 108a, and the epitaxial layer 110a can be continuously formed by the same process machine, thereby reducing the process complexity.

The drift region 106b may include an epitaxial layer 108b and an epitaxial layer 110b. The epitaxial layer 110b is located in the epitaxial layer 108b. In some embodiments, the epitaxial layer 108b and the epitaxial layer 110b may be epitaxial layers doped with a P-type dopant (e.g., boron) or an N-type dopant (e.g., phosphorus). The dopant concentration of the epitaxial layer 110b may be greater than the dopant concentration of the epitaxial layer 108b, so that the drift region 106b may have a gradient dopant concentration. Moreover, the drift region 106b may further include an epitaxial layer 112b. The epitaxial layer 108b is located in the epitaxial layer 112b. That is, the epitaxial layer 112b may be located between the epitaxial layer 108b and the substrate 100. The epitaxial layer 112b may be an undoped epitaxial layer. In some embodiments, the breakdown voltage of the high voltage transistor device can be flexibly adjusted by adjusting the thickness of the epitaxial layer 112b.

In addition, when the high voltage transistor structure 10 (FIG. 1E) to be manufactured is a PMOS transistor, the epitaxial layer 108b and the epitaxial layer 110b may be of P-type conductive type, and the material of the epitaxial layer 108b, the material of the epitaxial layer 110b, and the material of the epitaxial layer 112b may be silicon germanium (SiGe), respectively. When the high voltage transistor structure 10 (FIG. 1E) to be manufactured is an NMOS transistor, the epitaxial layer 108b and the epitaxial layer 110b may be of N-type conductive type, and the material of the epitaxial layer 108b, the material of the epitaxial layer 110b, and the material of the epitaxial layer 112b may be silicon phosphide (SiP), respectively. The method of forming the drift region 106b is, for example, sequentially forming the epitaxial layer 112b, the epitaxial layer 108b, and the epitaxial layer 110b in the recess R2 by a MOCVD method. Therefore, the epitaxial layer 112b, the epitaxial layer 108b, and the epitaxial layer 110b can be continuously formed by the same process machine, thereby reducing the process complexity.

In some embodiments, the drift region 106a and the drift region 106b may be simultaneously formed by the same process, thereby reducing the process complexity. That is, the epitaxial layer 112a and the epitaxial layer 112b may be simultaneously formed by the same process, the epitaxial layer 108a and the epitaxial layer 108b may be simultaneously formed by the same process, and the epitaxial layer 110a and the epitaxial layer 110b may be simultaneously formed by the same process. In some embodiments, the size (e.g., depth and/or width) of the epitaxial layer 108b may be greater than the size (e.g., depth and/or width) of the epitaxial layer 108a. In some embodiments, the size (e.g., depth and/or width) of the epitaxial layer 110b may be greater than the size (e.g., depth and/or width) of the epitaxial layer 110a. In some embodiments, the size (e.g., depth and/or width) of the epitaxial layer 112b may be greater than the size (e.g., depth and/or width) of the epitaxial layer 112a.

A cap layer 114a and a cap layer 114b are respectively formed on the drift region 106a and the drift region 106b. In some embodiments, the breakdown voltage of the high voltage transistor device can be flexibly adjusted by adjusting the thickness of the cap layer 114a and/or the thickness of the cap layer 114b. The material of the cap layer 114a and the material of the cap layer 114b may be an undoped epitaxial material, respectively. In some embodiments, the material of the cap layer 114a and the material of the cap layer 114b may be undoped epitaxial silicon, respectively. In some embodiments, when the high voltage transistor structure 10 (FIG. 1E) to be manufactured is a PMOS transistor, the material of the cap layer 114a and the material of the cap layer 114b may be silicon germanium (SiGe), respectively. When the high voltage transistor structure 10 (FIG. 1E) to be manufactured is an NMOS transistor, the material of the cap layer 114a and the material of the cap layer 114b may be silicon phosphide (SiP), respectively. The method for forming the cap layer 114a and the cap layer 114b is, for example, a MOCVD method. In some embodiments, the cap layer 114a and the cap layer 114b may be simultaneously formed by the same process. In some embodiments, the drift region 106a, the drift region 106b, the cap layer 114a, and the cap layer 114b can be continuously formed by the same process machine, thereby reducing the process complexity.

After the cap layer 114a and the cap layer 114b are formed, the hard mask layer 102a may be removed. The method of removing the hard mask layer 102a is, for example, a wet etching method. In some embodiments, after the hard mask layer 102a is removed, a cleaning process may be performed.

Figure 1E:
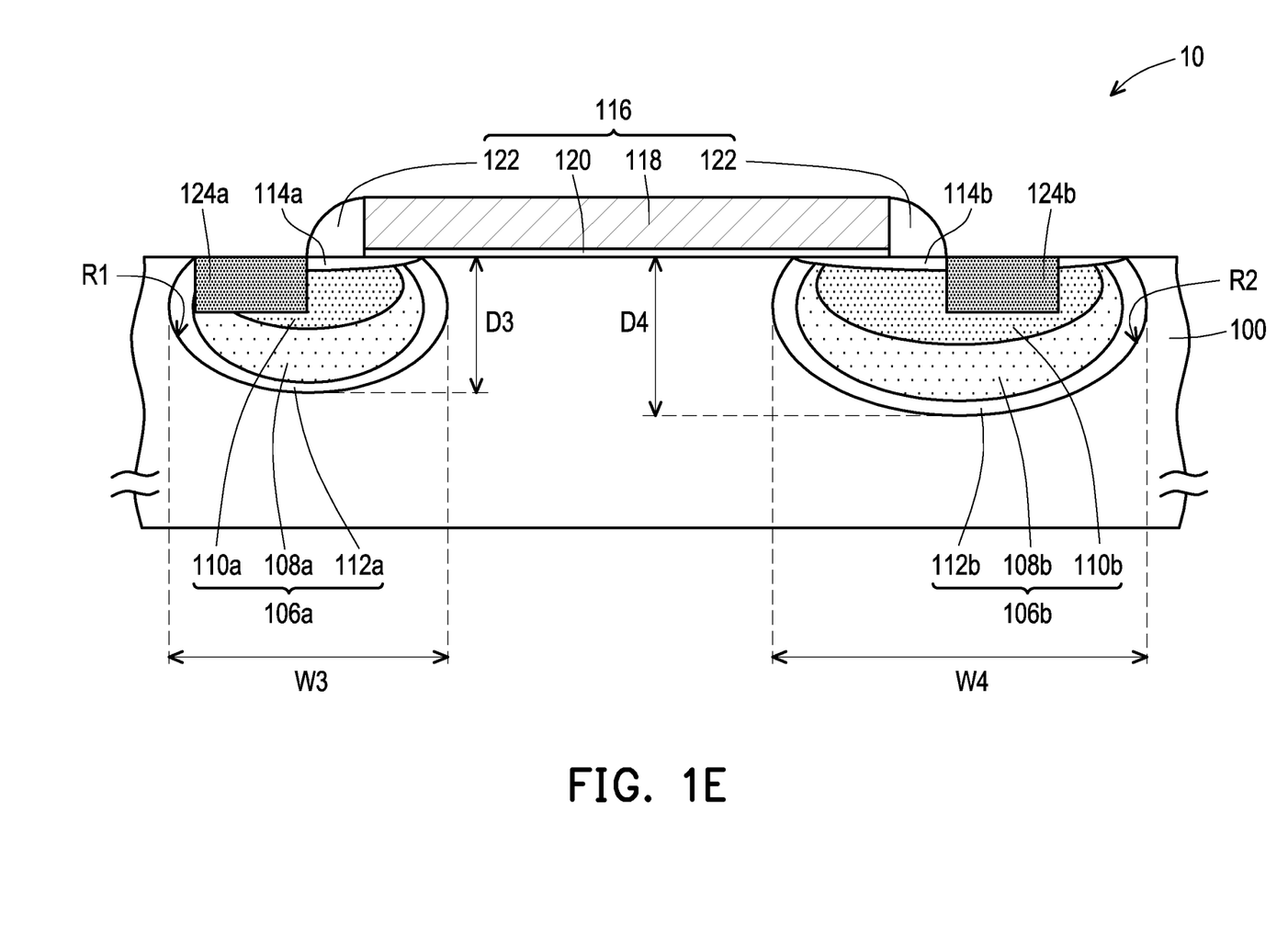

Referring to FIG. 1E, a gate structure 116 is formed on the substrate 100. The gate structure 116 is located over at least a portion of the drift region 106a and at least a portion of the drift region 106b. In addition, the cap layer 114a may be located between the gate structure 116 and the drift region 106a, and the cap layer 114b may be located between the gate structure 116 and the drift region 106b.

The gate structure 116 may include a gate 118 and a gate dielectric layer 120. The gate 118 is disposed on the substrate 100. The material of the gate 118 is, for example, doped polysilicon, but the invention is not limited thereto. The gate dielectric layer 120 is located between the gate 118 and the substrate 100. The material of the gate dielectric layer 120 is, for example, silicon oxide. Furthermore, the gate structure 116 may further include a spacer 122. The spacer 122 is disposed on the sidewall of the gate 118. The spacer 122 may be a single-layer structure or a multilayer structure. The material of the spacer 122 may be silicon oxide, silicon nitride, or a combination thereof.

A source and drain region 124a and a source and drain region 124b are respectively formed in the drift region 106a and the drift region 106b. The source and drain region 124a and the source and drain region 124b are located on two sides of the gate structure 116. In addition, a portion of the source and drain region 124a and a portion of the source and drain region 124b may be respectively located in the cap layer 114a and the cap layer 114b. The dopant concentration of the source and drain region 124a may be greater than the dopant concentration of the epitaxial layer 110a. The dopant concentration of the source and drain region 124b may be greater than the dopant concentration of the epitaxial layer 110b. When the high voltage transistor structure 10 is a PMOS transistor, the source and drain region 124a and the source and drain region 124b may be of P-type conductive type. When the high voltage transistor structure 10 is an NMOS transistor, the source and drain region 124a and the source and drain region 124b may be of N-type conductive type. The method of forming the source and drain region 124a and the source and drain region 124b is, for example, an ion implantation method.

In some embodiments, since a high voltage (VDD) is applied to the source and drain region 124b, the drift region 106b with a greater size may be disposed close to the source and drain region 124b. For example, when the high voltage transistor structure 10 is a PMOS transistor, a high voltage (VDD) is applied to the source region (e.g., source and drain region 124b), and the drift region 106b with a greater size may be disposed close to the source and drain region 124b. When the high voltage transistor structure 10 is an NMOS transistor, a high voltage (VDD) is applied to the drain region (e.g., source and drain region 124b), and the drift region 106b with a greater size may be disposed close to the source and drain region 124b.

Hereinafter, the high voltage transistor structure 10 of the present embodiment will be described with reference to FIG. 1E. In addition, although the method of forming the high voltage transistor structure 10 is described by taking the above method as an example, the invention is not limited thereto.

Referring to 1E, the high voltage transistor structure 10 includes a substrate 100, a drift region 106a, a drift region 106b, a cap layer 114a, a cap layer 114b, a gate structure 116, a source and drain region 124a, and a source and drain region 124b. In some embodiments, the high voltage transistor structure 10 may be a double diffused drain metal oxide semiconductor (DDDMOS). The drift region 106a and the drift region 106b are disposed in the substrate 100. The cap layer 114a and the cap layer 114b are respectively disposed on the drift region 106a and the drift region 106b. The gate structure 116 is disposed on the substrate 100 and located over at least a portion of the drift region 106a and at least a portion of the drift region 106b. The source and drain region 124a and the source and drain region 124b are respectively disposed in the drift region 106a and the drift region 106b and located on two sides of the gate structure 116. The size of the drift region 106a and the size of the drift region 106b are asymmetric. Moreover, the material, forming method, and configuration of each of the components in the high voltage transistor structure 10 have been described in detail in the above embodiments, and the description thereof is omitted.

Based on the above embodiments, in the high voltage transistor structure 10 and the manufacturing method thereof, the size of the drift region 106a and the size of the drift region 106b are asymmetric, thereby increasing the breakdown voltage of the high voltage transistor device. In addition, the breakdown voltage of the high voltage transistor device can be flexibly adjusted by adjusting the size of the drift region 106a and/or the size of the drift region 106b. Furthermore, the breakdown voltage of the high voltage transistor device can be flexibly adjusted by adjusting the thickness of the cap layer 114a and/or the thickness of the cap layer 114b.

In summary, the high voltage transistor structure and the manufacturing method of the aforementioned embodiments can increase the breakdown voltage of the high voltage transistor device and can flexibly adjust the breakdown voltage of the high voltage transistor device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A high voltage transistor structure, comprising:
    a substrate;
    a first drift region and a second drift region disposed in the substrate;
    a first cap layer and a second cap layer respectively disposed on the first drift region and the second drift region;
    a gate structure disposed on the substrate and located over at least a portion of the first drift region and at least a portion of the second drift region; and
    a first source and drain region and a second source and drain region respectively disposed in the first drift region and the second drift region and located on two sides of the gate structure, wherein
    a size of the first drift region and a size of the second drift region are asymmetric, and
    each of the first drift region and the second drift region comprises:
        a first epitaxial layer; and
        a second epitaxial layer located in the first epitaxial layer, wherein
        the first epitaxial layer, the second epitaxial layer, the first source and drain region, and the second source and drain region have the same conductive type.

2. The high voltage transistor structure according to claim 1, wherein a material of the first drift region and a material of the second drift region respectively comprise an epitaxial material.

3. The high voltage transistor structure according to claim 1, wherein the size of the second drift region is greater than the size of the first drift region.

4. The high voltage transistor structure according to claim 1, wherein a depth of the second drift region is greater than a depth of the first drift region.

5. The high voltage transistor structure according to claim 1, wherein a width of the second drift region is greater than a width of the first drift region.

6. The high voltage transistor structure according to claim 1, wherein
a dopant concentration of the second epitaxial layer is greater than a dopant concentration of the first epitaxial layer, and
a dopant concentration of the first source and drain region and a dopant concentration of the second source and drain region are greater than the dopant concentration of the second epitaxial layer.

7. The high voltage transistor structure according to claim 6, wherein each of the first drift region and the second drift region further comprises:
a third epitaxial layer, wherein the first epitaxial layer is located in the third epitaxial layer, and the third epitaxial layer is an undoped epitaxial layer.

8. The high voltage transistor structure according to claim 1, wherein
the first cap layer is located between the gate structure and the first drift region, and
the second cap layer is located between the gate structure and the second drift region.

9. The high voltage transistor structure according to claim 1, wherein a material of the first cap layer and a material of the second cap layer respectively comprise an undoped epitaxial material.

10. The high voltage transistor structure according to claim 1, wherein the gate structure comprises:
a gate disposed on the substrate; and
a gate dielectric layer located between the gate and the substrate.

11. The high voltage transistor structure according to claim 10, wherein the gate structure further comprises:
a spacer disposed on a sidewall of the gate.

12. A method of manufacturing a high voltage transistor structure, comprising:
providing a substrate;
forming a first drift region and a second drift region in the substrate;
respectively forming a first cap layer and a second cap layer on the first drift region and the second drift region;
forming a gate structure on the substrate, wherein the gate structure is located over at least a portion of the first drift region and at least a portion of the second drift region; and
respectively forming a first source and drain region and a second source and drain region in the first drift region and the second drift region, wherein
the first source and drain region and the second source and drain region are located on two sides of the gate structure,
a size of the first drift region and a size of the second drift region are asymmetric, and
each of the first drift region and the second drift region comprises:
a first epitaxial layer; and
a second epitaxial layer located in the first epitaxial layer, wherein
the first epitaxial layer, the second epitaxial layer, the first source and drain region, and the second source and drain region have the same conductive type.

13. The method of manufacturing the high voltage transistor structure according to claim 12, wherein a method of forming the first drift region and the second drift region comprises:
forming a first recess and a second recess in the substrate; and
respectively forming the first drift region and the second drift region in the first recess and the second recess.

14. The method of manufacturing the high voltage transistor structure according to claim 12, wherein a material of the first drift region and a material of the second drift region respectively comprise an epitaxial material.

15. The method of manufacturing the high voltage transistor structure according to claim 12, wherein the size of the second drift region is greater than the size of the first drift region.

16. The method of manufacturing the high voltage transistor structure according to claim 12, wherein a depth of the second drift region is greater than a depth of the first drift region.

17. The method of manufacturing the high voltage transistor structure according to claim 12, wherein a width of the second drift region is greater than a width of the first drift region.

18. The method of manufacturing the high voltage transistor structure according to claim 12, wherein
a dopant concentration of the second epitaxial layer is greater than a dopant concentration of the first epitaxial layer, and
a dopant concentration of the first source and drain region and a dopant concentration of the second source and drain region are greater than the dopant concentration of the second epitaxial layer.

19. The method of manufacturing the high voltage transistor structure according to claim 18, wherein each of the first drift region and the second drift region further comprises:
a third epitaxial layer, wherein the first epitaxial layer is located in the third epitaxial layer, and the third epitaxial layer is an undoped epitaxial layer.

20. The method of manufacturing the high voltage transistor structure according to claim 12, wherein
the first cap layer is located between the gate structure and the first drift region, and
the second cap layer is located between the gate structure and the second drift region.

* * * * *